United States Patent
Guan et al.

(10) Patent No.: US 12,550,524 B2
(45) Date of Patent: Feb. 10, 2026

(54) DISPLAY SUBSTRATE AND MANUFACTURING METHOD THEREOF, PREPARATION APPARATUS AND DISPLAY APPARATUS

(71) Applicant: BOE Technology Group Co., Ltd., Beijing (CN)

(72) Inventors: Feng Guan, Beijing (CN); Yongfeng Zhang, Beijing (CN); Chaolu Wang, Beijing (CN); Meng Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 335 days.

(21) Appl. No.: 18/265,045

(22) PCT Filed: Jul. 11, 2022

(86) PCT No.: PCT/CN2022/104986
§ 371 (c)(1),
(2) Date: Jun. 2, 2023

(87) PCT Pub. No.: WO2024/011372
PCT Pub. Date: Jan. 18, 2024

(65) Prior Publication Data
US 2024/0423007 A1     Dec. 19, 2024

(51) Int. Cl.
*H10K 50/12* (2023.01)
*H10K 59/00* (2023.01)
(Continued)

(52) U.S. Cl.
CPC ......... *H10K 50/12* (2023.02); *H10K 59/1201* (2023.02); *H10K 59/771* (2023.02); *H10K 50/115* (2023.02)

(58) Field of Classification Search
CPC .. H10K 50/12; H10K 59/1201; H10K 59/771; H10K 50/115; H10K 50/00; H10K 59/00; H10K 71/00; H10D 99/00
See application file for complete search history.

(56) References Cited

U.S. PATENT DOCUMENTS

| 2018/0138252 A1 | 5/2018 | Cheng et al. |
| 2022/0093824 A1 | 3/2022 | Choi et al. |

FOREIGN PATENT DOCUMENTS

| CN | 107565053 A | 1/2018 |
| CN | 107742676 A | 2/2018 |

(Continued)

OTHER PUBLICATIONS

English Machine Translation of Ju CN110165062 (Year: 2025).*

*Primary Examiner* — Donald L Raleigh
(74) *Attorney, Agent, or Firm* — WHDA, LLP

(57) ABSTRACT

A display substrate and a preparation method thereof, a preparation apparatus and a display apparatus are provided, which relate to the technical field of display. The display substrate includes a plurality of light-emitting areas and non-light-emitting areas surrounding respective light-emitting areas. The display substrate includes: a base substrate; a light-emitting functional layer disposed at a side of the base substrate, the light-emitting functional layer including a light-emitting material located in the plurality of light-emitting areas and the non-light-emitting areas. The light-emitting material in the non-light-emitting areas is doped with destructive ions, and the destructive ions are configured for destroying luminescent characteristics of the light-emitting material in the non-light-emitting area.

16 Claims, 5 Drawing Sheets

(51) Int. Cl.
*H10K 59/12* (2023.01)
*H10K 50/115* (2023.01)

(56) References Cited

FOREIGN PATENT DOCUMENTS

| | | | | |
|---|---|---|---|---|
| CN | 110164921 A | | 8/2019 | |
| CN | 110165062 A | * | 8/2019 | ............. H10K 50/15 |
| CN | 114256306 A | | 3/2022 | |

* cited by examiner

DISPLAY SUBSTRATE AND MANUFACTURING METHOD THEREOF, PREPARATION APPARATUS AND DISPLAY APPARATUS

TECHNICAL FIELD

The present disclosure relates to the technical field of display devices and, more particularly, to a display substrate, a method for preparing the display substrate, an apparatus for preparing the display substrate and a display apparatus.

BACKGROUND

An Organic Light Emitting Display (OLED) is a display device that produces electroluminescence by using a multi-layer organic thin film structure through carrier injection and recombination. At present, in order to meet user's requirements for display effect and adaptability to application scenarios, technicians focus on improving pixel resolution and display size of an OLED display all the time, which raises higher requirements for various conditions such as display design, internal material, and production processes.

SUMMARY

A display substrate is provided in an embodiment of the present disclosure, which includes a plurality of light-emitting areas and non-light-emitting areas surrounding respective light-emitting areas, wherein the display substrate includes:

a base substrate;

a light-emitting functional layer disposed at a side of the base substrate, the light-emitting functional layer including a light-emitting material located in the plurality of light-emitting areas and the non-light-emitting areas;

wherein the light-emitting material in the non-light-emitting areas is doped with destructive ions, the destructive ions is configured for destroying luminescent characteristics of the light-emitting material in the non-light-emitting area.

Optionally, the plurality of light-emitting areas each includes a first color light-emitting area and a second color light-emitting area, the first color light-emitting area is configured for emitting a first color light; and the second color light-emitting area is configured for emitting a second color light, the first color and the second color is different;

wherein the light-emitting functional layer includes a first color light-emitting material capable of emitting the first color light, and the first color light-emitting material located in the second color light-emitting area is doped with the destructive ions.

Optionally, a distance between orthographic projections of two adjacent light-emitting areas on the base substrate is greater than or equal to 5 nm and less than or equal to 50 µm.

Optionally, the plurality of light-emitting areas include at least one of: a red light area, a green light area, a blue light area, and a white light area.

Optionally, the light-emitting functional layer further includes at least one of:

a hole transport layer, a hole injection layer, a light-emitting layer, an electron transporting layer, a charge generation layer and an electron injection layer.

Optionally, the hole transport layer includes: a first hole transport layer and a second hole transport layer; the hole injection layer includes a first hole injection layer and a second hole injection layer; and the electron injection layer includes a first electron injection layer and a second electron injection layer; and the light-emitting layer includes:

a first light-emitting layer located at a side of the first hole injection layer or the first hole transport layer away from the base substrate;

a second light-emitting layer located at a side of the first light-emitting layer away from the base substrate;

a third light-emitting layer located at a side of the second hole injection layer or the second hole transport layer away from the base substrate;

wherein the second hole injection layer and the second hole transport layer are located at sides of the first hole injection layer and the first hole transport layer away from the base substrate; the charge generation layer and the first electron injection layer are located between the first light-emitting layer and the second hole injection layer or the second hole transport layer; and the electron transporting layer or the second electron injection layer is located at the side of the second hole injection layer or the second hole transport layer away from the base substrate.

Optionally, a length of the base substrate is greater than or equal to 1850 mm and a width of the base substrate is greater than or equal to 1500 mm.

Optionally, the light-emitting material includes at least one of: an organic electroluminescent material and a quantum dot light-emitting material.

Optionally, the display substrate further includes: a first electrode located between the light-emitting functional layer and the base substrate, and a second electrode located at a side of the light-emitting functional layer away from the base substrate.

Optionally, the destructive ions include at least one of: fluorine ion, phosphorus ion, nitrogen ion, boron fluoride ion and argon ion.

A display apparatus is provided in the embodiment of the present disclosure, including the display substrate according to any one of embodiments stated above.

A method for preparing a display substrate is provided in the embodiment of the present disclosure, wherein the display substrate includes a light-emitting area and a non-light-emitting area and the method includes:

providing a base substrate;

forming a light-emitting material on the base substrate, an orthographic projection of the light-emitting material on the base substrate covering the light-emitting area and the non-light-emitting area; and implanting destructive ions into the light-emitting material in the non-light-emitting area to obtain the display substrate; wherein the destructive ions is configured for destroying luminescent characteristics of the light-emitting material in the non-light-emitting area.

Optionally, implanting the destructive ions into the light-emitting material in the non-light-emitting area to obtain the display substrate includes;

forming a shielding layer at a side of the light-emitting material away from the base substrate, wherein an orthographic projection of the shielding layer on the base substrate covers the light-emitting area;

implanting the destructive ions into the light-emitting material not shielded by the shielding layer; and removing the shielding layer to obtain the display substrate.

Optionally, the shielding layer includes: a first adhesive layer and a first organic layer; and forming the shielding layer at the side of the light-emitting material away from the base substrate includes:

forming a second organic layer at the side of the light-emitting material away from the base substrate, an orthographic projection of the second organic layer on the base substrate covering the orthographic projection of the light-emitting material on the base substrate;

forming a second adhesive layer on the second organic layer, an orthographic projection of the second adhesive layer on the base substrate covering the orthographic projection of the second organic layer on the base substrate;

developing the second adhesive layer with an anhydrous developer in a nitrogen environment to form the first adhesive layer on the second organic layer, the orthographic projection of the first adhesive layer on the base substrate covering the light-emitting area; and removing a part of the second organic layer that is not covered by the first adhesive layer by development to obtain the first organic layer;

wherein the second adhesive layer includes an anhydrous oxygen photoresist.

Optionally, the light-emitting material includes an organic light-emitting material; and the step of forming the light-emitting material on the base substrate includes:

forming the organic light-emitting material on the base substrate by surface evaporation using an open mask.

An apparatus for preparing a display substrate is provided in the embodiment of the present disclosure, wherein the display substrate includes a light-emitting area and a non-light-emitting area; and the apparatus includes:

a substrate stage configured for providing a base substrate;

an evaporation module configured for forming a light-emitting material on the base substrate, an orthographic projection of the light-emitting material on the base substrate covering the light-emitting area and the non-light-emitting area; and an ion implantation module for implanting destructive ions into the light-emitting material in the non-light-emitting area to obtain the display substrate; wherein the destructive ions is configured for destroying luminescent characteristics of the light-emitting material in the non-light-emitting area.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art may be briefly introduced below. Apparently, the figures that are described below are embodiments of the present disclosure, and a person skilled in the art can obtain other figures according to these figures without paying creative work. It should be noted that the proportions in the drawings are only indicative and do not represent actual proportions.

DETAILED DESCRIPTION

In order to make the objects, the technical solutions and the advantages of the embodiments of the present disclosure clearer, the technical solutions of the embodiments of the present disclosure may be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In order to improve preparation precision and obtain OLED displays with high pixel resolution, in the related art, it is proposed to use a fine metal mask (FMM Mask), namely, to fabricate the FMM on a patterned substrate by invar electroplating, which is then used to form an organic thin film structure of an OLED display, and thus electroluminescence can be realized by using the organic thin film structure. The fine metal mask plate can effectively improve pixel resolution and production yield of a display panel. However, the applicants found that the fine metal mask plate is not suitable for industrial production and cannot be used for production of large-size OLED displays because of its strict requirements on equipment and production conditions. Considering the demand of users for high-resolution and large-size OLED displays, embodiments of the present disclosure aims to solve a problem that it is difficult to realize the high-resolution and large-size OLED displays.

The embodiments of the present disclosure may be described in the following with reference to the attached drawings of the description.

Figure 1:
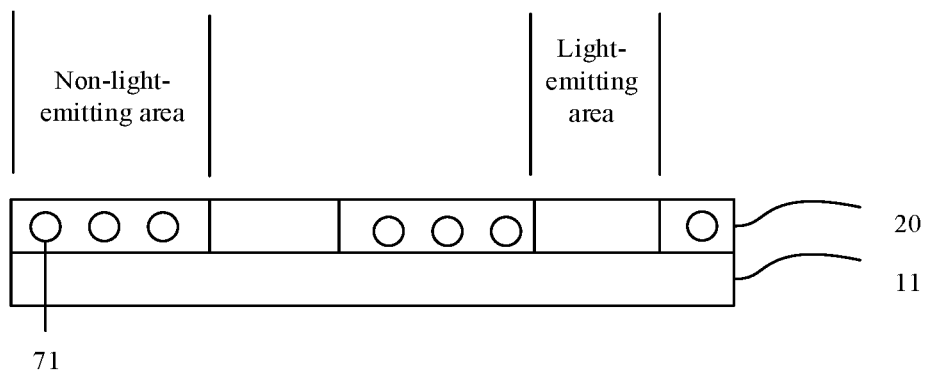
FIG. 1 schematically shows a schematic diagram of a structure of a display substrate according to an embodiment of the present disclosure.

Reference is made to FIG. 1, which schematically shows a schematic diagram of a structure of a display substrate according to an embodiment of the present disclosure. As shown in FIG. 1, a display substrate is provided in an embodiment of the present disclosure, which includes a plurality of light-emitting areas and non-light-emitting areas surrounding respective light-emitting areas.

Specifically, a plurality of light-emitting areas are areas that can emit colored light or white light, and the light-emitting areas may include light-emitting areas of a same color or light-emitting areas of different colors. Illustratively, the light-emitting area may include a red light-emitting area and a blue light-emitting area.

The non-light-emitting area may be an area on the display substrate except the light-emitting areas, which may emit no light.

The display substrate includes:
a base substrate 11; and
a light-emitting functional layer disposed at a side of the base substrate 11, the light-emitting functional layer including a light-emitting material 20 located in the plurality of light-emitting areas and the non-light-emitting areas.

Figure 2:
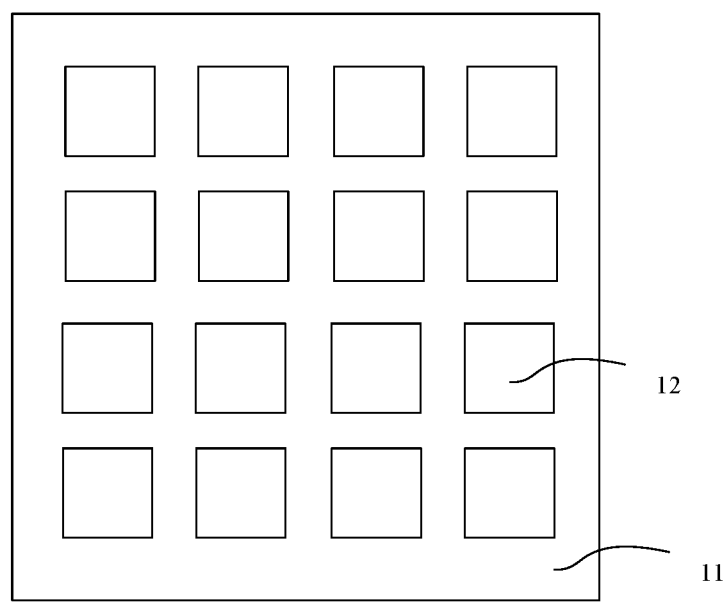
FIG. 2 schematically shows a schematic diagram of a structure of a base substrate according to an embodiment of the present disclosure.

Reference is made to FIG. 2, which schematically shows a schematic diagram of a structure of a base substrate 11 according to an embodiment of the present disclosure. As shown in FIG. 2, optionally, the base substrate 11 may be attached to a first electrode 12 (anode electrode) in advance for preparing the display substrate. Specifically, the base substrate 11 may be a thin film transistor array (TFT Array) backplane, and may include a base material, a pixel circuit and a driving circuit. The base material can include an opaque rigid backplane or flexible backplane, which serves to bear or protect the light-emitting functional layer. The base substrate 11 may include any one of metal, an inorganic material and an organic material. In order to realize preparation of the flexible display panel, further, the base substrate 11 may include a flexible organic material.

Specifically, the light-emitting functional layer may include an organic light-emitting material 20.

In an optional embodiment, the light-emitting material 20 includes at least one of: an organic electroluminescent material and a quantum dot light-emitting material.

For the organic electroluminescent material, a purpose of light emission and display can be achieved by driving an organic semiconductor thin film with a current. For the quantum dot light-emitting material, electrons and holes at two sides aggregates in a quantum dot layer to form photons, which recombine to emit light.

In an optional embodiment, the display substrate may be a monochromatic light-emitting device. Illustratively, it may be a blue light-emitting device or a white light-emitting device.

In yet another optional embodiment, the display substrate may be a multi-color composite light emitting device, in which a composite light emitting pattern is formed with at least two colors. Illustratively, the display substrate may be an RGB primary color display substrate.

Figure 3:
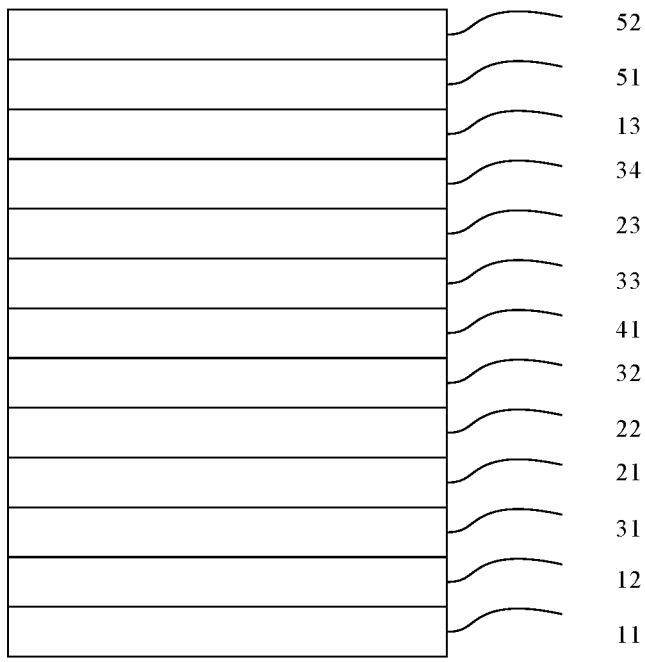
FIG. 3 schematically shows a schematic diagram of a stacked structure of another display substrate according to an embodiment of the present disclosure.

Reference is made to FIG. 3, which schematically shows a diagram of a stacked structure of a display substrate according to an embodiment of the present disclosure. As shown in FIG. 3 and further, it is considered that the composite light emitting device can provide different colors of light through a plurality of light-emitting layers to realize combined light emission, and for this, a display substrate is further provided in an optional embodiment of the present disclosure.

A hole transport layer includes a first hole transport layer and a second hole transport layer.

A hole injection layer includes a first hole injection layer and a second hole injection layer.

An electron injection layer includes a first electron injection layer and a second electron injection layer.

A light-emitting layer includes a first light-emitting layer, a second light-emitting layer and a third light-emitting layer.

The first light-emitting layer is located at a side of the first hole injection layer or the first hole transport layer away from the base substrate.

Specifically, the first light-emitting layer may be a red light-emitting layer 21.

The second light-emitting layer is located at a side of the first light-emitting layer away from the base substrate.

Specifically, the second light-emitting layer may be a green light-emitting layer 22.

The third light-emitting layer is located at a side of the second hole injection layer or the second hole transport layer away from the base substrate.

Specifically, the third light-emitting layer may be a blue light-emitting layer 23.

The second hole injection layer and the second hole transport layer are located at sides of the first hole injection layer and the first hole transport layer away from the base substrate.

The charge generation layer 41 and the first electron injection layer are located between the first light-emitting layer and the second hole injection layer or the second hole transport layer.

An electron transporting layer or the second electron injection layer is located at the side of the second hole injection layer or the second hole transport layer away from the base substrate.

In combination with above embodiments, an example of a stacked structure of a display substrate is further provided in an embodiment of the present disclosure. In this exemplary stacked structure, the display substrate may sequentially include:
a base substrate 11, a first electrode 12, a first hole layer 31, a red light-emitting layer 21, a green light-emitting layer 22, a first electron injection layer 32, a charge generation layer 41, a second hole layer 33, a blue light-emitting layer 23, a charge layer 34, a second electrode 13, a thin film packaging layer 51 and a color filter layer 52.

The light-emitting material 20 includes the red light-emitting layer 21, the green light-emitting layer 22 and the blue light-emitting layer 23. The first hole layer 31 may include at least one of the first hole transport layer and the first hole injection layer.

The second hole layer 33 may include at least one of the second hole transport layer and the second hole injection layer. The charge layer 34 may include at least one of the second electron injection layer and the electron transporting layer.

Further, for a composite light-emitting device, in order to facilitate independent preparation of light-emitting areas with different colors, the light-emitting functional layer may include a plurality of sub-light-emitting layers which are sequentially arranged in an array, and each sub-light-emitting layer may include light-emitting areas with different colors in the light-emitting area, and orthographic projections of the light-emitting areas with different colors on the base substrate 11 do not overlap with each other to emit light with different colors at the same time, which serve as sub-pixels to be combined to form light emission of a pixel, thereby realizing display of various colors.

Illustratively, a first sub-light-emitting layer may include a first color light-emitting area in the light-emitting area for emitting a first color light. A second sub-light-emitting layer may include a second color light-emitting area in the light-emitting area for emitting a second color light. An orthographic projection of the first color light-emitting area on the base substrate 11 and an orthographic projection of the second color light-emitting area on the base substrate 11 do not overlap with each other.

In order to further reduce a thickness of the display substrate and improve portability of the device, in another optional embodiment, the light-emitting areas with different colors can also be arranged in a same layer. Illustratively, a light-emitting material 20 of a red light-emitting area may be located in a same layer as a light-emitting material 20 of a blue light-emitting area.

The light-emitting material 20 in the non-light-emitting areas is doped with destructive ions 71, and the destructive ions 71 are configured for destroying luminescent characteristics of the light-emitting material 20 in the non-light-emitting areas.

Specifically, the destruction ions 71 may be an ion that blocks internal transport of carriers in the light-emitting material 20 in the non-light-emitting area.

In an optional embodiment, the destruction ions 71 include at least one of: fluorine ion, phosphorus ion, nitrogen ion, boron fluoride ion and argon ion.

It can be seen from above embodiments that in the present disclosure, considering characteristics of the light-emitting material 20 realizing electroluminescence by using the carrier transport, the above structural design is proposed for a purpose of facilitating preparation and production, in which the light-emitting material 20 in the non-light-emitting area is implanted and doped with regionally doped destructive ions 71 to enable the light-emitting material 20 in the non-light-emitting area not to emit light. Compared with high requirements in related art for equipment and processes, it is easy to realize preparation of high-resolution and large-size OLED displays.

In embodiments of the present disclosure, it can be considered that functional difference between the light-emitting area and the non-light-emitting area can be realized by destroying functions of other layers in the display substrate in the non-light-emitting area except the light-emitting functional layer. For this, in an optional embodiment, the non-light-emitting area can be enabled to emit no light by destroying functions in the non-light-emitting area of at least one of the following of the non-light-emitting area;

the first electrode 12, the first hole layer 31, the red light-emitting layer 21, the green light-emitting layer 22, the blue light-emitting layer 23, the first electron injection layer 32, the charge generation layer 41, the second hole layer 33, the charge layer 34 and the second electrode 13.

As shown in FIG. 3, considering that RGB or RGBW displaying is generally adopted in currently OLED displays, in order to realize composite light emission of sub-pixels, a display substrate is further provided in an optional embodiment of the present disclosure. The plurality of light-emitting areas each include a first color light-emitting area and a second color light-emitting area, and the first color light-emitting area is configured for emitting the first color light.

The second color light-emitting area is configured for emitting the second color light, and the first color and the second color are different.

The light-emitting functional layer includes a first color light-emitting material 20 capable of emitting the first color light, and the first color light-emitting material 20 located in the second color light-emitting area is doped with the destructive ions 71.

Specifically, the first color light and the second color light may be light with different colors.

Illustratively, the first color light may be red light, and the second color light may be blue light or green light or white light.

Further, the light-emitting functional layer may further include a second color light-emitting material 20 capable of emitting a second color light, and the second color light-emitting material 20 located in the first color light-emitting area is doped with the destructive ions 71.

In order to further facilitate preparation of the light-emitting areas with different colors, a display substrate is further provided in an optional embodiment of the present disclosure. The plurality of light-emitting areas further includes third color light-emitting areas, and the third color light-emitting areas are light-emitting areas in the plurality of light-emitting areas except the first color light-emitting areas and the second color light-emitting areas, and is configured for emitting a third color light.

The light-emitting functional layer includes a third color light-emitting material 20 capable of emitting the third color light.

Specifically, in order to realize combined light emission of the light-emitting areas of different colors to realize pixel combination, any of the color light-emitting materials 20 may only emit light in this color light-emitting area, and this color light-emitting material 20 may be doped with the destructive ions 71 in other color light-emitting areas.

With the above embodiments, a display substrate with a structure capable of easily realizing high pixel resolution is realized. For this, a display substrate is further provided in an optional embodiment of the present disclosure, in which a distance between orthographic projections of two adjacent light-emitting areas on the base substrate 11 is greater than or equal to 5 nm and less than or equal to 50 μm.

The two adjacent light-emitting areas may be light-emitting areas of different colors, for example, a red light-emitting area and a blue light-emitting area.

In the embodiment of the present disclosure, preparation precision can be improved through structural design, to obtain a display substrate with more compact light-emitting areas, thereby pixel resolution of OLED display is improved.

Considering that RGB or RGBW displaying is generally adopted in currently OLED displays, for this, a display substrate is further provided in an optional embodiment of the present disclosure. The plurality of light-emitting areas include at least one of: a red light-emitting area, a green light-emitting area, a blue light-emitting area and a white light-emitting area.

In combination with the above embodiments, the embodiment of the present disclosure can realize OLED display with any one of the organic electroluminescent material 20 and the quantum dot light-emitting material 20, and the organic electroluminescent material 20 can also realize white organic light emitting display (WOLED). In order to realize a WOLED display function, a display substrate is further provided in an optional embodiment of the present disclosure. The light-emitting functional layer further includes at least one of:

a hole transport layer, a hole injection layer, a light-emitting layer, an electron transporting layer, a charge generation layer and an electron injection layer.

The light-emitting layer can be a light-emitting material, which serves as an organic electroluminescent layer. The hole transport layer (HTL), the hole injection layer (HIL), the electron transporting layer (ETL), the charge generation layer (CGL) and the electron injection layer (EIL) can be configured with electrons or holes as carriers to realize controllable directional and orderly migration of the carriers under action of an electric field, to complete transporting of charges and further enable the light-emitting material 20 to emit light.

The display substrate obtained in the above embodiment is easy to realize preparation and production of a large-size display panel. For this, a display substrate is further provided in an optional embodiment of the present disclosure. A length of the base substrate 11 is greater than or equal to 1850 mm, and a width of the base substrate 11 is greater than or equal to 1500 mm.

In the above embodiments, a large size can be achieved for the display substrate according to the embodiment of the present disclosure, and in another optional embodiment, the display substrate according to the embodiment of the present disclosure can also have a small and/or medium size, and the length of the base substrate 11 can be less than 1850 mm and the width of the base substrate 11 can be less than 1500 mm.

In order to further realize the OLED display, it is further considered in the embodiment of the present disclosure that electrodes are disposed in the display substrate to power the light-emitting functional layer to realize electroluminescence. For this, a display substrate is further provided in an optional embodiment of the present disclosure, which further includes a first electrode 12 located between the light-emitting functional layer and the base substrate 11, and a second electrode 13 located at a side of the light-emitting functional layer away from the base substrate 11.

Specifically, the first electrode 12 may be an anode electrode and the second electrode 13 may be a cathode electrode. The anode electrode can be made of any one of silver Ag and Indium tin oxide (ITO).

In order to realize a complete display function of the display substrate, a display substrate is provided in an optional embodiment of the present disclosure, which further includes:

a thin film encapsulation layer 51 (TFE) located at a side of the second electrode 13 away from the base substrate 11, configured for encapsulating and protecting the light-emitting functional layer to prevent the light-emitting material 20 from being corroded by water and oxygen in outside air.

Further, a display substrate is further provided in an optional embodiment of the present disclosure, which further includes:

a color filter layer 52 located at a side of the thin film packaging layer 51 away from the base substrate 11, configured for filtering and integrating various colors of light emitted by the light-emitting functional layer.

On a basis of a same inventive concept, a display apparatus is further provided in an embodiment of the present disclosure, which includes the display substrate according to any one of the above embodiments.

Figure 4:
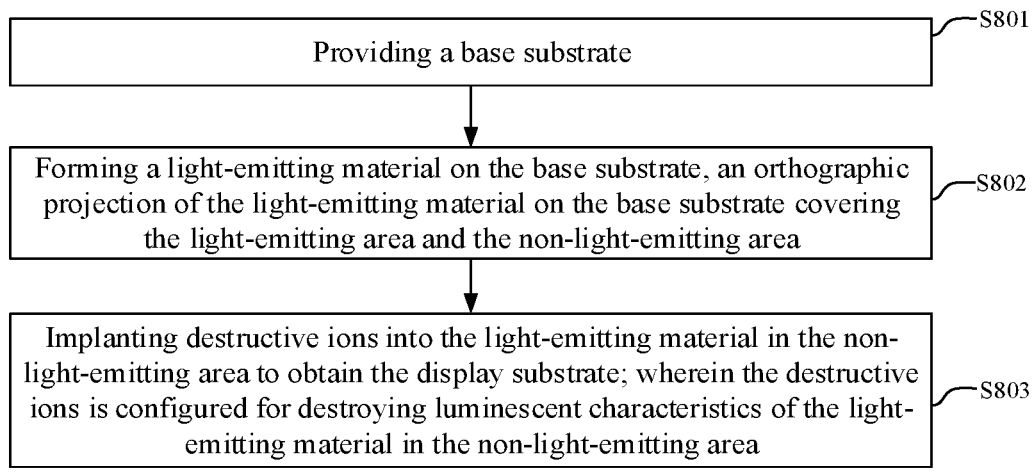
FIG. 4 schematically shows a flow chart of steps of a method for preparing a display substrate according to an embodiment of the present disclosure.

Reference is made to FIG. 4, which schematically shows a flow chart of steps of a method for preparing a display substrate according to an embodiment of the present disclosure. As shown in FIG. 4, based on the same inventive concept, a method for preparing a display substrate is further provided in an embodiment of the present disclosure, which can be used to implement the display substrate of any of the above embodiments.

The display substrate includes a light-emitting area and a non-light-emitting area.

The method includes Steps S801 to S803.

In step S801, a base substrate 11 is provided.

When the base substrate 11 is provided, the base substrate 11 can be provided carrying an electrode which is placed upward. Illustratively, the electrode may be an anode electrode.

In step S802, the light-emitting material 20 is formed on the base substrate 11, and an orthographic projection of the light-emitting material 20 on the base substrate 11 covers the light-emitting area and the non-light-emitting area.

Different from the related art in which it is necessary to use the FMM to obtain the organic light-emitting material 20, in order to accurately prepare the light-emitting material 20 for realizing pixel luminescence, in the present disclosure, the light-emitting material 20 with an orthographic projection covering the light-emitting area and the non-light-emitting area can be directly prepared, and requirements for equipment and processes are greatly reduced. For this, a method of forming a light-emitting material 20 is further provided in an optional embodiment of the present disclosure. The light-emitting material 20 includes an organic light-emitting material 20. The method includes:

forming the organic light-emitting material 20 on the base substrate 11 by surface evaporation by using an open mask.

Unlike the FMM, which needs to deposit the pixel light-emitting material 20 at a precise position and has high requirements for equipment and processes, in the present disclosure, the open mask is used for surface evaporation, and the organic light-emitting material 20 is deposited on a whole surface of the light-emitting area and the non-light-emitting area, which greatly reduces requirements for equipment and processes and is easy to realize preparation and production of the display substrate.

In step S803, destructive ions 71 are implanted into the light-emitting material 20 in the non-light-emitting area to obtain the display substrate. The destruction ions 71 are configured to destroy luminescent characteristics of the light-emitting material 20 in the non-light-emitting area.

In an optional embodiment, the destructive ions 71 may be implanted after the light-emitting material 20 is formed and before thin film encapsulation. Process parameters of implanting the destructive ions 71 can be adjusted according to a processing position of implanting the destructive ions 71.

Specifically, the light-emitting material 20 in the light-emitting area can be shielded by a mask, and the destructive ions 71 can be implanted into the light-emitting material 20 in the non-light-emitting area by an ion implantation process, so that the destructive ions 71 only destroy and block carrier transporting of the light-emitting material 20 in the non-light-emitting area, thereby that the light-emitting material 20 in the light-emitting area can achieve the luminescent function is ensured, while the light-emitting material 20 in the non-light-emitting area doped with the destructive ions 71 does not emit light.

By the above embodiments, in the present disclosure, the light-emitting material 20 can be regionally implanted and doped by using the destructive ions 71, so that the light-emitting material 20 in the non-light-emitting area does not emit light, and thus a correspondingly designed light-emitting area is formed. Compared with the related art, the requirements for equipment and processes are greatly reduced, and thus preparation of high-resolution and large-size OLED displays can be easily realized.

Figure 5:
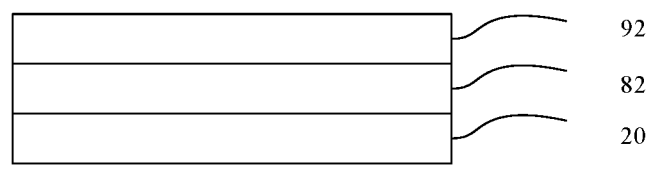
FIG. 5 schematically shows a schematic structural diagram in a preparation process of a display substrate according to an embodiment of the present disclosure.
Figure 6:
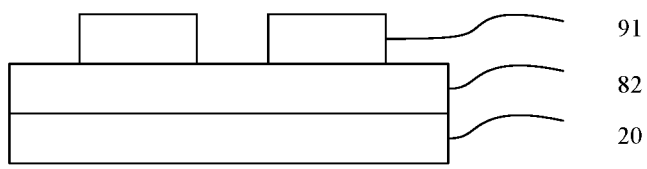
FIG. 6 schematically shows a schematic structural diagram in a preparation process of another display substrate according to an embodiment of the present disclosure.
Figure 7:
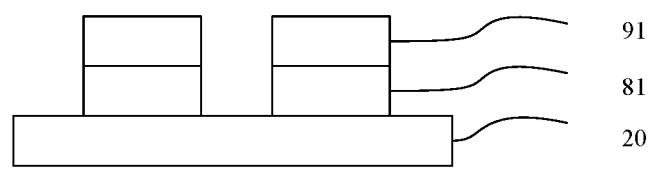
FIG. 7 schematically shows a schematic structural diagram in a preparation process of another display substrate according to an embodiment of the present disclosure.

Reference is made to FIG. 5 to FIG. 7, in which FIG. 5 schematically shows a schematic structural diagram in a preparation process of a display substrate according to an embodiment of the present disclosure; FIG. 6 schematically shows a schematic structural diagram in a preparation process of another display substrate according to an embodiment of the present disclosure; and FIG. 7 schematically shows a schematic structural diagram in a preparation process of another display substrate according to an embodiment of the present disclosure. As shown in FIG. 7, in the embodiment of the present disclosure, it is considered to shield the light-emitting area so that the destructive ions 71 can be regionally doped, and for this, a method for implanting the destructive ions 71 is further provided in an optional embodiment of the present disclosure, which includes steps S901 to S903.

In step S901, a shielding layer is formed at a side of the light-emitting material 20 away from the base substrate 11. An orthographic projection of the shielding layer on the base substrate 11 covers the light-emitting area.

Specifically, in order to facilitate preparation and lifting-off, and to protect the electroluminescent light-emitting material 20, the shielding layer may be organic. Further, the shielding layer can be made of a flexible organic material.

In step S902, the destructive ions 71 are implanted into the light-emitting material 20 that is not shielded by the shielding layer.

In the embodiment of the present disclosure, the light-emitting material 20 not shielded by the shielding layer can cover the non-light-emitting area, so the light-emitting area and the non-light-emitting area of the display substrate can be designed in advance, and the non-light-emitting area with a corresponding shape and at a corresponding position can be obtained by implanting the destructive ions 71 into the light-emitting material 20 not shielded by the shielding layer.

In step S903, the shielding layer is removed to obtain the display substrate.

Specifically, the shielding layer can be removed by a lift-off process. The orthographic projection of the shielding layer on the base substrate 11 covers the light-emitting area, and after the shielding layer is removed, the light-emitting material 20 in the light-emitting area can emit light toward a side away from the base substrate 11.

Further, considering that the light-emitting functional layer may include a plurality of sub-light-emitting layers, each sub-light-emitting layer may be prepared separately in the embodiment of the present disclosure. Therefore, in an optional embodiment of the disclosure, a shielding layer can be further formed at a side of a light-emitting material 20 of one sub light-emitting layer away from the base substrate 11 after the light-emitting material 20 corresponding to the sub light-emitting layer is formed at a time, and the destructive ions 71 are implanted into a light-emitting material 20 of the sub light-emitting layer that is not shielded by the shielding layer, and then the shielding layer is removed, to obtain the sub light-emitting layer.

An orthographic projection of the shielding layer on the base substrate 11 covers a light-emitting area of a color corresponding to the sub-light-emitting layer.

Illustratively, assuming that a sub-light-emitting layer needing to be formed at present is a red light-emitting layer 21, an orthographic projection of a red shielding layer on the base substrate 11 covers the red light-emitting area.

In view of a fact that light-emitting areas of different colors are arranged in the same layer, a shielding layer in a same layer can also be used in another optional embodiment of the present disclosure to obtain light-emitting areas of different colors in a same layer of light-emitting material 20 by implanting destructive ions 71 into the non-light-emitting areas.

As shown in FIG. 7, in order to effectively block the destructive ions 71 and enable the destructive ions 71 to destroy luminescent characteristics of the light-emitting material 20 in the non-light-emitting area, a method for forming a shielding layer is further provided in an optional embodiment of the present disclosure. The shielding layer includes a first adhesive layer 91 and a first organic layer 81.

The method includes steps S1001 to S1003.

In step S1001, a second organic layer 82 is formed at the side of the light-emitting material 20 away from the base substrate 11, and an orthographic projection of the second organic layer 82 on the base substrate 11 covers the orthographic projection of the light-emitting material 20 on the base substrate 11.

According to the embodiment of the present disclosure, the second organic layer 82 can be used to coat an entire surface of the light-emitting material 20, thereby reducing requirements of preparation for equipment and processes.

In step S1002, the first adhesive layer 91 is formed on the second organic layer 82, and an orthographic projection of the first adhesive layer 91 on the base substrate 11 covers the light-emitting area.

The first adhesive layer 91 can be obtained by development. It is easy to achieve high precision by developing to obtain the first adhesive layer 91, which is different from the FMM mask whose precision is difficult to be broken through, thus breaking through process bottleneck in a whole preparation process of the display substrate.

In step S1003, a part of the second organic layer 82 that is not covered by the first adhesive layer 91 is removed by development to obtain the first organic layer 81.

Because of covering of the second organic layer 82 or the first organic layer 81 on the light-emitting material 20, a photoresist can be protected from damaging material properties of the light-emitting material 20.

According to the embodiment of the present disclosure, both the first adhesive layer 91 and the first organic layer 81 can be formed by development, so that direct patterning of the light-emitting material 20 can be avoided by patterning the shielding layer, thus avoiding a precision or size problem existing in patterned deposition of the light-emitting material 20 with the FMM mask, and thus an OLED display with high pixel resolution and large size can be realized.

In combination with the above-described embodiments of the present disclosure, it is also considered to provide a method for destroying functions of other layers in the display substrate except the light-emitting functional layer in the non-light-emitting area, and for this, in another optional embodiment of the present disclosure, a shielding layer can be further disposed on at least one of the following in case that the at least one of the following is prepared, so as to destroy functions of the at least one of the following in the non-light-emitting area while protecting functions of at least one of the following from being destroyed;

the first electrode 12, the first hole layer 31, the red light-emitting layer 21, the green light-emitting layer 22, the blue light-emitting layer 23, the first electron injection layer 32, the charge generation layer 41, the second hole layer 33, the charge layer 34 and the second electrode 13.

In combination with the above-described embodiments of the present disclosure, differential function setting between the light-emitting areas and the non-light-emitting areas is made after preparing the second electrode 13 as a cathode. Further, because there is no need to consider functional damage to the electroluminescent material in the light-emitting functional layer, the shielding layer also can be prepared after preparing the second electrode 13 as the cathode in an optional embodiment of the present disclosure. The shielding layer may include a photoresist and an inorganic layer.

The inorganic layer is configured to isolate from water and oxygen, which may include silicon nitride. After the differential function setting between the light-emitting areas and the non-light-emitting areas is made, the photoresist can be removed and the inorganic layer can be remained as a packaging material to protect light-emitting devices in the display substrate from being corroded by external water and oxygen.

Further, a method for forming the first adhesive layer 91 is further provided in an optional embodiment of the present disclosure, which includes steps S1101 and S1102.

In step S1101, as shown in FIG. 5, the second adhesive layer 82 is formed on the second organic layer 82, and an orthographic projection of the second adhesive layer 82 on the base substrate 11 covers the orthographic projection of the second organic layer 82 on the base substrate 11.

The second adhesive layer 82 can be coated on a whole surface, which also reduces precision requirement for preparation of the adhesive layer and is easy to realize preparation of the shielding layer.

In step S1102, as shown in FIG. 6, the second adhesive layer 82 is developed with an anhydrous developer in a nitrogen atmosphere to obtain the first adhesive layer 91.

Preferably, the first adhesive layer 91 and the second adhesive layer 82 in the embodiment of the present disclosure may be photoresist.

Further, in an optional embodiment, the second adhesive layer 82 includes an anhydrous oxygen photoresist.

In the embodiment of the present disclosure, the second adhesive layer 82 of the anhydrous oxygen photoresist can be developed and etched with high precision in the nitrogen atmosphere and with the anhydrous developer.

Figure 8:
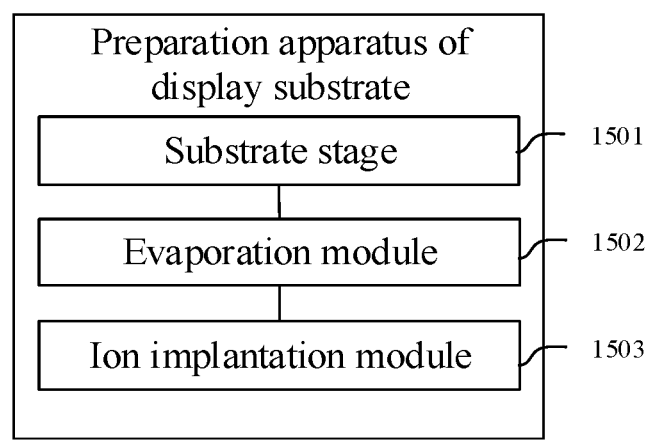
FIG. 8 schematically shows a structural block diagram of an apparatus for preparing a display substrate according to an embodiment of the present disclosure.

Reference is made to FIG. 8, which schematically shows a structural block diagram of an apparatus for preparing a display substrate according to an embodiment of the present disclosure. As shown in FIG. 8, based on the same inventive concept, the apparatus for preparing the display substrate is further provided in an embodiment of the present disclosure. The display substrate includes a light-emitting area and a non-light-emitting area.

The apparatus includes a substrate stage 1501, an evaporation module 1502 and an ion implantation module 1503.

The substrate stage 1501 is configured for providing a base substrate 11.

The evaporation module 1502 is configured for forming a light-emitting material 20 on the base substrate 11, and an orthographic projection of the light-emitting material 20 on the base substrate 11 covers the light-emitting area and the non-light-emitting area.

The ion implantation module 1503 is configured for implanting destructive ions 71 into the light-emitting material 20 in the non-light-emitting area to obtain the display substrate. The destruction ions 71 are configured to destroy luminescent characteristics of the light-emitting material 20 in the non-light-emitting area.

The various embodiments in this specification are described in a progressive manner. Each embodiment focuses on the differences from the other embodiments, and the same or similar parts between the various embodiments may be referred to each other.

The embodiments of each component in the present disclosure can be implemented by hardware, or by software modules running on one or more processors, or by their combination. A person skilled in the art should understand that the microprocessor or digital signal processor (DSP) can be used in practice to realize some or all functions of some or all components in the calculation and processing equipment according to the embodiments of the present disclosure the present disclosure. The present disclosure can also be implemented as the equipment or device programs (for example, computer programs and computer program products) used to execute part or all of the methods described here. The programs of implementing the present disclosure may be stored in a computer readable medium, or can have the form of one or more signals.

Such signals can be downloaded from the Internet site, or disposed on the carrier signal, or provided in any other form.

Figure 9:
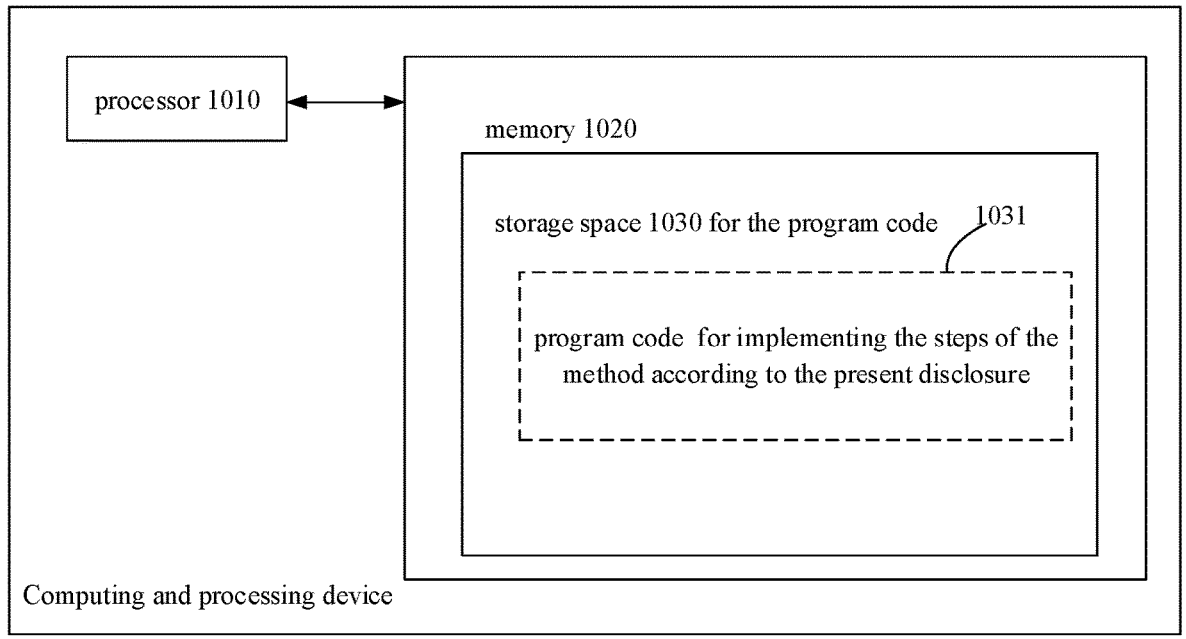
FIG. 9 schematically shows a block diagram of a computing processing device for executing the method according to the present disclosure.
Figure 10:
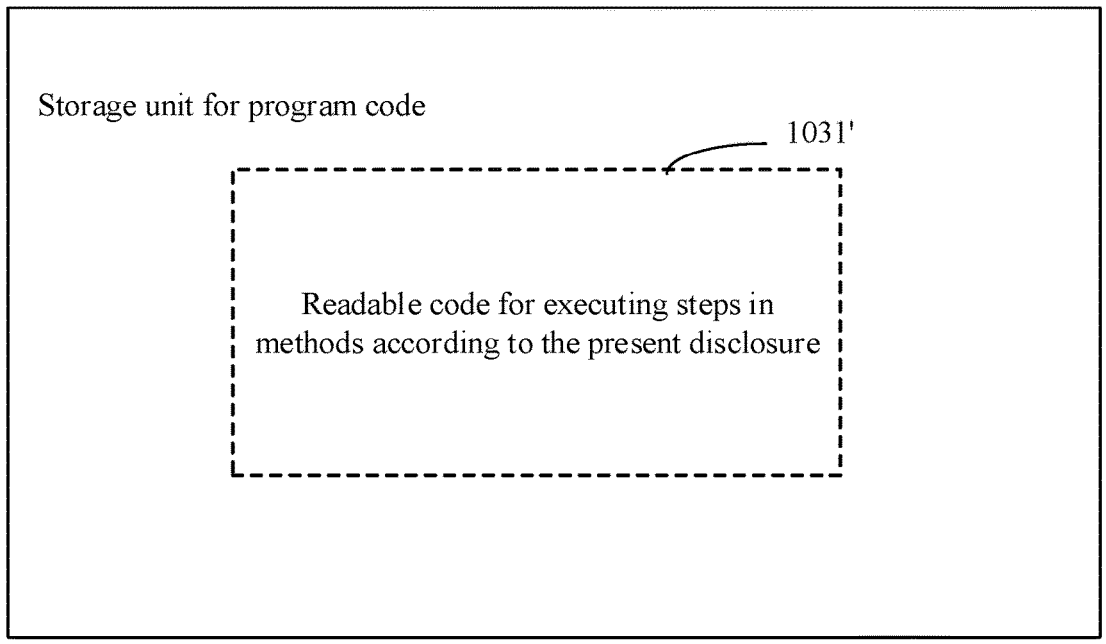
FIG. 10 schematically shows a storage unit for holding or carrying program codes for implementing the method according to the present disclosure.

For example, FIG. 9 shows a computing and processing device that can implement the method according to the present disclosure. The computing and processing device traditionally includes a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1030 for program code may contain program codes 1031 for individually implementing each of the steps of the above method. Those program codes may be read from one or more computer program products or be written into the one or more computer program products. Those computer program products include program code carriers such as a hard disk, a compact disk (CD), a memory card or a floppy disk. Such computer program products are usually portable or fixed storage units as shown in FIG. 10. The storage unit may have storage segments or storage spaces with similar arrangement to the memory 1020 of the computing and processing device in FIG. 9. The program codes may, for example, be compressed in a suitable form. Generally, the storage unit contains a computer-readable code 1031', which can be read by a processor like 1010. When those codes are executed by the computing and processing device, the codes cause the computing and processing device to implement each of the steps of the method described above.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "include" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

The piezoelectric material and the piezoelectric device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

After considering the specification and practicing the inventions disclosed here, a person skilled in the art may easily think of other embodiments of the present disclosure. The present disclosure aims to cover any variations, uses or adaptive changes in present disclosure. These variations, uses or adaptive changes follow the general principles of the present disclosure and include public knowledge or common technical means in this art that are not disclosed in the present disclosure. Specification and embodiments are only treated as illustrative, and the true scope and spirit of the present disclosure are stated in the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it may be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware including several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display substrate, comprising a plurality of light-emitting areas and non-light-emitting areas surrounding respective light-emitting areas, wherein the display substrate comprises:
a base substrate;
a light-emitting functional layer disposed at a side of the base substrate, the light-emitting functional layer comprising a light-emitting material located in the plurality of light-emitting areas and the non-light-emitting areas;
wherein the light-emitting material in the non-light-emitting areas is doped with destructive ions, the destructive ions is configured for destroying luminescent characteristics of the light-emitting material in the non-light-emitting area;
the plurality of light-emitting areas each comprises a first color light-emitting area and a second color light-emitting area, the first color light-emitting area is configured for emitting a first color light; and the second color light-emitting area is configured for emitting a second color light, the first color and the second color is different; and
the light-emitting functional layer comprises a first color light-emitting material capable of emitting the first color light, and the first color light-emitting material located in the second color light-emitting area is doped with the destructive ions.

2. The display substrate according to claim 1, wherein a distance between orthographic projections of two adjacent light-emitting areas on the base substrate is greater than or equal to 5 nm and less than or equal to 50 μm.

3. The display substrate according to claim 1, wherein the plurality of light-emitting areas comprise at least one of: a red light area, a green light area, a blue light area, and a white light area.

4. The display substrate according to claim 1, wherein the light-emitting functional layer further comprises at least one of:
a hole transport layer, a hole injection layer, a light-emitting layer, an electron transporting layer, a charge generation layer and an electron injection layer.

5. The display substrate according to claim 4, wherein the hole transport layer comprises: a first hole transport layer and a second hole transport layer; the hole injection layer comprises a first hole injection layer and a second hole injection layer; and the electron injection layer comprises a first electron injection layer and a second electron injection layer; and
the light-emitting layer comprises:
a first light-emitting layer located at a side of the first hole injection layer or the first hole transport layer away from the base substrate;
a second light-emitting layer located at a side of the first light-emitting layer away from the base substrate;
a third light-emitting layer located at a side of the second hole injection layer or the second hole transport layer away from the base substrate;
wherein the second hole injection layer and the second hole transport layer are located at sides of the first hole injection layer and the first hole transport layer away from the base substrate; the charge generation layer and the first electron injection layer are located between the first light-emitting layer and the second hole injection layer or the second hole transport layer; and the electron transporting layer or the second electron injection layer is located at the side of the second hole injection layer or the second hole transport layer away from the base substrate.

6. The display substrate according to claim 1, wherein a length of the base substrate is greater than or equal to 1850 mm and a width of the base substrate is greater than or equal to 1500 mm.

7. The display substrate according to claim 1, wherein the light-emitting material comprises at least one of: an organic electroluminescent material and a quantum dot light-emitting material.

8. The display substrate according to claim 1, further comprising: a first electrode located between the light-emitting functional layer and the base substrate, and a second electrode located at a side of the light-emitting functional layer away from the base substrate.

9. The display substrate according to claim 1, wherein the destructive ions comprise at least one of: fluorine ion, phosphorus ion, nitrogen ion, boron fluoride ion and argon ion.

10. A display apparatus, comprising the display substrate according to claim 1.

11. A method for preparing a display substrate, wherein the display substrate comprises a light-emitting area and a non-light-emitting area and the method comprises:
provide a base substrate;
forming a light-emitting material on the base substrate, an orthographic projection of the light-emitting material on the base substrate covering the light-emitting area and the non-light-emitting area; and
implanting destructive ions into the light-emitting material in the non-light-emitting area to obtain the display substrate; wherein the destructive ions is configured for destroying luminescent characteristics of the light-emitting material in the non-light-emitting area;
wherein implanting the destructive ions into the light-emitting material in the non-light-emitting area to obtain the display substrate comprises:
forming a shielding layer at a side of the light-emitting material away from the base substrate, wherein an orthographic projection of the shielding layer on the base substrate covers the light-emitting area;
implanting the destructive ions into the light-emitting material not shielded by the shielding layer; and
removing the shielding layer to obtain the display substrate;
wherein the shielding layer comprises: a first adhesive layer and a first organic layer; and forming the shielding layer at the side of the light-emitting material away from the base substrate comprises:
forming a second organic layer at the side of the light-emitting material away from the base substrate, an orthographic projection of the second organic layer on the base substrate covering the orthographic projection of the light-emitting material on the base substrate;
forming a second adhesive layer on the second organic layer, an orthographic projection of the second adhesive layer on the base substrate covering the orthographic projection of the second organic layer on the base substrate;
developing the second adhesive layer with an anhydrous developer in a nitrogen environment to form the first adhesive layer on the second organic layer, the orthographic projection of the first adhesive layer on the base substrate covering the light-emitting area; and
removing a part of the second organic layer that is not covered by the first adhesive layer by development to obtain the first organic layer;
wherein the second adhesive layer comprises an anhydrous oxygen photoresist.

12. The display apparatus according to claim 10, wherein a distance between orthographic projections of two adjacent light-emitting areas on the base substrate is greater than or equal to 5 nm and less than or equal to 50 μm.

13. The display apparatus according to claim 10, wherein the plurality of light-emitting areas comprise at least one of: a red light area, a green light area, a blue light area, and a white light area.

14. The display apparatus according to claim 10, wherein the light-emitting functional layer further comprises at least one of:
a hole transport layer, a hole injection layer, a light-emitting layer, an electron transporting layer, a charge generation layer and an electron injection layer.

15. The method for preparing the display substrate according to claim 11, wherein the light-emitting material comprises an organic light-emitting material; and the step of forming the light-emitting material on the base substrate comprises:
forming the organic light-emitting material on the base substrate by surface evaporation using an open mask.

16. An apparatus for preparing a display substrate, wherein the display substrate comprises a light-emitting area and a non-light-emitting area; and the apparatus comprises:
a substrate stage configured for providing a base substrate;
an evaporation module configured for forming a light-emitting material on the base substrate, an orthographic projection of the light-emitting material on the base substrate covering the light-emitting area and the non-light-emitting area; and
an ion implantation module for implanting destructive ions into the light-emitting material in the non-light-emitting area to obtain the display substrate; wherein the destructive ions is configured for destroying luminescent characteristics of the light-emitting material in the non-light-emitting area;
wherein the light-emitting area comprises a first color light-emitting area and a second color light-emitting area, the first color light-emitting area is configured for emitting a first color light; and the second color light-emitting area is configured for emitting a second color light, the first color and the second color is different; and
the light-emitting material comprises a first color light-emitting material capable of emitting the first color light, and the first color light-emitting material located in the second color light-emitting area is doped with the destructive ions.

* * * * *